(12) United States Patent
Ikeda et al.

(10) Patent No.: US 8,035,128 B2
(45) Date of Patent: Oct. 11, 2011

(54) SEMICONDUCTOR DEVICE AND METHOD FOR FABRICATING THE SAME

(75) Inventors: Nariaki Ikeda, Tokyo (JP); Shusuke Kaya, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 135 days.

(21) Appl. No.: 12/580,015

(22) Filed: Oct. 15, 2009

(65) Prior Publication Data

US 2010/0117146 A1     May 13, 2010

(30) Foreign Application Priority Data

Nov. 13, 2008    (JP) ................................. 2008-291475

(51) Int. Cl.
     *H01L 29/739*      (2006.01)
(52) U.S. Cl. ................. 257/192; 257/194; 257/E29.081; 257/E29.091; 257/E29.246
(58) Field of Classification Search .................. 257/192, 257/194, E29.081, E29.091, E29.246
See application file for complete search history.

(56) References Cited

U.S. PATENT DOCUMENTS

| | | | | |
|---|---|---|---|---|
| 7,838,904 B2 * | 11/2010 | Nakazawa et al. | ............ | 257/194 |
| 2006/0289901 A1 * | 12/2006 | Sheppard et al. | ............ | 257/256 |
| 2011/0089468 A1 * | 4/2011 | Zhang | ........................... | 257/194 |

FOREIGN PATENT DOCUMENTS

JP       11-261052       9/1999

\* cited by examiner

*Primary Examiner* — Ngan Ngo
(74) *Attorney, Agent, or Firm* — Turocy & Watson, LLP

(57) ABSTRACT

There is provided a semiconductor device and a method for fabricating the same whose withstanding characteristic may be enhanced and whose ON resistance may be reduced. A MIS-type HEMT includes a carrier traveling layer made of a group-III nitride semiconductor and formed on a supporting substrate, a carrier supplying layer made of a group-III nitride semiconductor and formed on the carrier traveling layer, source and drain electrodes formed on the carrier supplying layer, insulating films formed on the carrier supplying layer and a gate electrode formed on the insulating films. The insulating film is formed in a region interposed between the source and drain electrodes and has a trench whose cross-section is inverted trapezoidal and whose upper opening is wider than a bottom thereof. The gate electrode is formed at least from the bottom of the trench onto the insulating films on the side of the drain electrode.

6 Claims, 10 Drawing Sheets

SEMICONDUCTOR DEVICE AND METHOD FOR FABRICATING THE SAME

CROSS-REFERENCE TO RELATED APPLICATIONS

This application claims priority to Japanese patent application No. 2008-291475, filed on Nov. 13, 2008, the entire content of which is incorporated herein by reference.

BACKGROUND OF THE INVENTION

1. Field of the Invention

The present invention relates to a semiconductor device and a method for fabricating the same and more specifically to a semiconductor device using gallium nitride (GaN) semiconductor materials and a method for fabricating the same.

2. Description of the Related Art

Conventionally, gallium nitride (GaN) semiconductor materials have a large band gap energy as compared to gallium arsenide (GaAs) materials and have an excellent heat resistance property, so that they may be operated in high temperature. Due to such merits, developments of semiconductor devices using the GaN semiconductor materials and GaN/AlGaN (gallium aluminum nitride) semiconductor materials in particular are actively conducted lately.

Still more, FETs (Field Effect Transistor) using a MIS (Metal Insulator Semiconductor) structure for a gate structure of a transistor using the GaN/AlGaN semiconductor material are being developed lately for the purpose of reducing a gate leak current as disclosed in Japanese Patent Application Laid-Open No. Hei.11-261052, for example.

[Patent Document 1] Japanese Patent Application Laid-Open No. Hei.11-261052.

By the way, there is one having a HEMT (High Electron Mobility Transistor) structure as a lateral-type semiconductor element using the late GaN semiconductor material. The GaN semiconductor element having the HEMT structure (hereinafter referred to simply as a GaN HEMT) can utilize two-dimensional electron gas that is generated around a hetero junction interface as carriers, so that it is capable of reducing on resistance. Still more, the GaN HEMT uses a schottky electrode for its gate structure, so that it is capable of enhancing its withstanding characteristic. It is noted that the on resistance described above refers to a resistance between a source and a drain during operation.

However, due to a structure of the schottky electrode, its gate leak current is greater than that of the semiconductor element having the MIS structure, so that there has been a problem that it is difficult to use the GaN HEMT for a semiconductor element that is required to have a relatively high withstanding characteristic.

Still more, the GaN HEMT has a problem that a drain current remarkably reduces when an influence of a current collapse between the gate and the drain increases and the on resistance increases.

It is conceivable to apply the MIS structure disclosed by Japanese Patent Application Laid-Open No. Hei.11-261052 described above to the GaN HEMT as a method for solving such a problem. However, the structure disclosed by Japanese Patent Application Laid-Open No. Hei.11-261052 has not fully improved the influence of the current collapse between the gate and the drain. Due to that, it has been unable to realize a degree of high withstanding characteristic and low-on resistance required by late power transistors and others by the conventional GaN HEMT.

SUMMARY OF THE INVENTION

Accordingly, in view of the problems described above, the present invention seeks to provide a semiconductor device and a method for fabricating the same whose withstanding characteristic may be enhanced and on resistance may be reduced.

According to one aspect of the invention, a semiconductor device includes a carrier traveling layer made of a group-III nitride semiconductor and formed on a supporting substrate, a carrier supplying layer formed on the carrier traveling layer and made of a group-III nitride semiconductor whose band gap energy is greater than that of the carrier traveling layer, source and drain electrodes that ohmically contact with the carrier supplying layer, an insulating film formed on the carrier supplying layer and a gate electrode formed on the insulating film. The insulating film includes a first trench formed in a region interposed between the source and the drain electrodes, the first trench has a shape whose cross-section is inverted trapezoidal in which an upper opening is wider than a bottom thereof and the gate electrode is formed at least from the bottom of the first trench onto the insulating film on the side of the drain electrode.

Preferably, the insulating film includes a first insulating film formed on the carrier supplying layer and having an aperture formed between the source and drain electrodes and a second insulating film that covers at least an upper surface of the carrier supplying layer exposed by the aperture. The bottom of the first trench is formed at least by a surface of the second insulating film formed within the aperture.

Preferably, an angle formed between the respective sides of the first trench and the bottom thereof is 90 degrees or more.

Preferably, the insulating film at least at the bottom of the first trench is a nitride film.

Preferably, the semiconductor device also includes an interlayer film formed on the insulating film and an electrode that contacts with the source electrode and whose part extends on the interlayer insulating film above the gate electrode.

According to another aspect of the invention, the first trench reaches to the inside of the carrier traveling layer and the carrier traveling layer has a second trench formed on an upper side of the carrier traveling layer itself and the first trench includes the second trench under the first trench itself.

It is noted that in the invention, the trench portion of the first trench positioned within the carrier traveling layer is called as the second trench. The second trench is formed when the first trench reaches to the inside of the carrier traveling layer. Accordingly, when the first trench is formed in contact with the surface of the carrier traveling layer without reaching to the inside of the carrier traveling layer, the first trench does not include the second trench and the semiconductor device contains only the first trench.

A method for fabricating a semiconductor device includes steps of forming an insulating film having a first trench on a carrier supplying layer of a supporting substrate having a carrier traveling layer, the carrier supplying layer formed on the carrier traveling layer and source and drain electrodes that ohmically contact with the carrier traveling layer and forming a gate electrode at least from a bottom of the first trench onto the insulating film on the side of the drain electrode. The first trench is formed in a region interposed between the source and drain electrodes so as to have a shape whose cross-section is inverted trapezoidal in which an upper opening is wider than a bottom thereof.

In the method, preferably the insulating film forming step includes steps of forming a first insulating film on the carrier supplying layer, forming an aperture that exposes the carrier supplying layer in the first insulating film interposed between the source and drain electrodes and forming a second insulating film that covers the first insulating film and a surface of the aperture. The first trench is formed so that it becomes a trench formed by the surface of the second insulating film formed within the aperture.

In the method, preferably the insulating film forming step includes steps of forming a first insulating film on the carrier supplying layer, forming a second insulating film on the first insulating film and forming an aperture that exposes the first insulating film in the second insulating film between the source and drain electrodes. The first trench is formed so that it becomes a trench formed by side surfaces and an upper surface of the first insulating film within the aperture.

Preferably, the first trench is formed by removing at least part of the insulating film by wet etching.

Preferably, the insulating film forming step includes a step of forming a second trench that reaches to an upper part of the carrier traveling layer itself under the aperture formed in the aperture forming step and an under part of the first trench itself is composed of the second trench.

Figure 1:
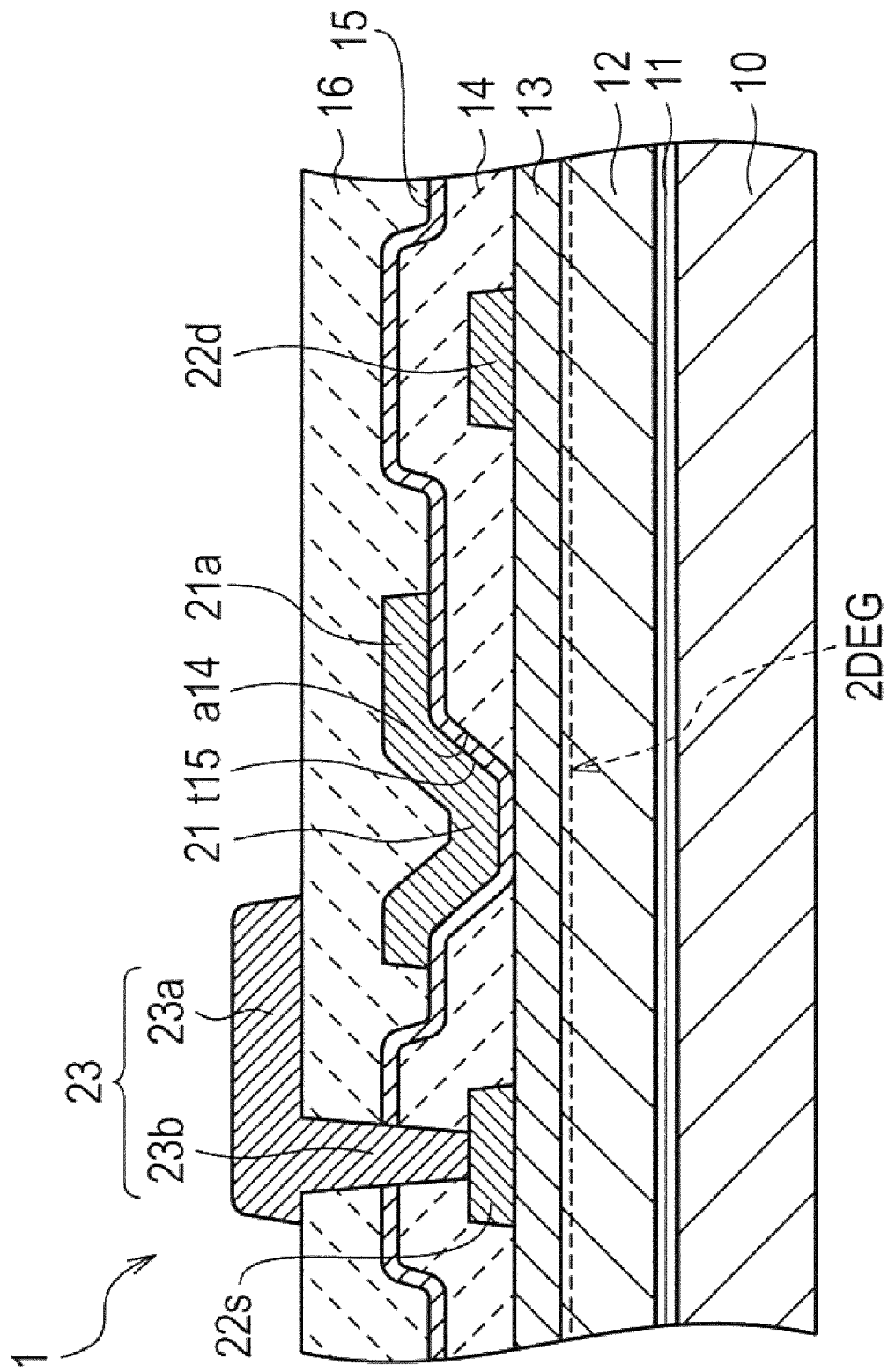
FIG. 1 is a section view showing a schematic structure of a MIS-type HEMT according to a first embodiment of the invention.

DESCRIPTION OF REFERENCE NUMERALS 1, 1A, 1B, 2: MIS-type HEMT
10: supporting substrate
11: buffer layer
12: carrier traveling layer
13: carrier supplying layer
14: passivation film
15: gate insulating film
16: interlayer insulating film
21: gate electrode
21a, 23a: FP portion
22s: source electrode
22d: drain electrode
23: FP electrode
23b: contact portion
24: insulating film
a14, a23: aperture
t13, t15, t24: trench
2DEG: two-dimensional electron gas

BEST MODES FOR CARRYING OUT THE INVENTION

The best modes for carrying out the invention will be explained below with reference to the drawings. It is noted that the embodiments described below should not be construed to limit the invention. Still more, each drawing merely schematically shows shapes, sizes and positional relationships of parts to a degree that allows one to understand the contents of the invention and accordingly, the invention is not limited only to the shapes, sizes and positional relationships illustrated in each drawing. Still more, part of hatching of a cross-section is omitted in each drawing to clearly show the structure. Further, numerical values described later are merely suitable examples of the invention, so that the invention is not limited to such exemplified numerical values.

First Embodiment

A MIS-type HEMT 1 as a semiconductor device using a GaN semiconductor material of a first embodiment of the invention will be explained in detail below with reference to the drawings.

(Structure)

FIG. 1 is a section view showing a schematic structure of the MIS type HEMT 1 of the first embodiment. It is noted that FIG. 1 shows a cross-sectional structure when the MIS-type HEMT 1 is cut along a plane along a gate length direction (or referred to also as a channel length direction) and vertically to a supporting substrate 10.

As shown in FIG. 1, the MIS-type HEMT 1 has the supporting substrate 10, a carrier traveling layer 12 formed on the supporting substrate 10, a buffer layer 11 disposed between the supporting substrate 10 and the carrier traveling layer 12, a carrier supplying layer 13 formed on the carrier traveling layer 12, source and drain electrodes 22s and 22d disposed separately on the carrier supplying layer 13, a passivation film 14 covering the source and drain electrodes 22s and 22d and having an aperture a14 formed between the source and drain electrodes 22s and 22d, a gate insulating film 15 covering an upper surface of the passivation film 14 and an inner surface of the aperture a14 and a gate electrode 21 formed at least on a bottom of a trench t15 formed by a surface of the gate insulating film 15 within the aperture a14. The MIS-type HEMT 1 also has an interlayer insulating film 16 formed so as to cover the gate electrode 21 on the gate insulating film 15 and a field plate (FP) electrode 23 that electrically leads out the source electrode 22s on the interlayer insulating film 16.

In this structure, a silicon (111) substrate may be used for the supporting substrate 10. However, the invention is not limited to the silicon substrate and may use any substrate as long as the substrate allows the carrier traveling layer 12 (or the buffer layer 11) to be crystallized thereon, such as a sapphire substrate, a silicon carbonate (SiC) substrate, a magnesium oxide (MgO) substrate and a zinc oxide (ZnO) substrate for example.

A so-called undoped GaN layer containing no impurity as a dopant for example may be used for the carrier traveling layer 12. However, the invention is not limited to that and may use any layer as long as it is made of a group-III nitride semiconductor whose band gap energy is smaller than that of the carrier supplying layer 13 described later, such as AlGaN, InGaN and others for example.

A so-called undoped AlGaN layer containing no impurity as a dopant for example may be used for the carrier supplying layer 13. However, the invention is not limited to that and the carrier supplying layer 13 may be modified variously corresponding to a combination with the carrier traveling layer 12 described above, such as AlGaN, BAlGaN and InBAlN containing n-type impurities as the dopant.

It becomes possible to form a hetero junction interface by junctioning the carrier supplying layer 13 made of the semiconductor whose band gap energy is greater than that of the carrier traveling layer 12 on the upper surface of the carrier traveling layer 12 as described above. As a result, two-dimensional electron gas 2DEG is generated in the carrier traveling layer 12 around the hetero junction interface as shown in FIG. 1. The MIS-type HEMT 1 of the present embodiment can use the two-dimensional electron gas 2DEG as carriers, so that it can realize low-on resistance as compared to a FET and the like for example.

The buffer layer 11 assures adhesion between the supporting substrate 10 and the carrier traveling layer 12. An aluminum nitride (AlN) film and the like may be used for the buffer layer 11. However, the invention is not limited to that and its component and layer structure may be appropriately modified depending on the materials used for the supporting substrate 10 and the carrier traveling layer 12, such as a laminate film in which AlN thin films and GaN thin films are alternately formed for example.

The source and drain electrodes 22s and 22d that ohmically contact with the carrier supplying layer 13 are disposed by keeping a certain distance on the carrier supplying layer 13 or on a low-resistance layer contacting with the carrier traveling layer 12. Preferably, the source and drain electrodes 22s and 22d are formed by using conductors that ohmically contact with the carrier supplying layer 13. It is possible to reduce resistance between the source and the drain of the MIS-type HEMT 1 and to reduce the on resistance further by using the ohmically contactable conductors. There exists an alloy of titanium (Ti), aluminum (Al) and silicon (Si) as such an electrode material. However, the invention is not limited to this alloy or to other ohmically contactable metals and may use any material as long as the material is a conductor material whose resistance formed at a junction interface with the carrier supplying layer 13 is fully small. It is also possible to form a tungsten (W) film for example over the source and drain electrodes 22s and 22d to lower their resistance.

The passivation film 14 is formed on the carrier supplying layer 13 so as to cover the source and drain electrodes 22s and 22d. The passivation film 14 may be formed by using silicon oxide ($SiO_2$) for example. However, the invention is not limited to that and the passivation film 14 may be formed by using various insulating materials such as silicon nitride (SiN) and high dielectric materials such as gallium oxide ($Ga_2O_3$), hafnium oxide ($HfO_2$), hafnium silicide oxide nitride (HfSiON), alumina ($Al_2O_3$) and zirconium oxide (ZrO) for example. It is preferable to form the passivation film 14 by a SiN film whose refractive index is around 2.0 to 2.2 for example because it brings about an effect of reducing the current collapse in the semiconductor layers (the carrier traveling layer 12 and the carrier supplying layer 13) under the passivation film 14.

The aperture a14 that exposes the carrier supplying layer 13 as described above is formed at part of the passivation film 14 (first insulating film) positioned between the source and drain electrodes 22s and 22d. The aperture a14 has a cross-section of an inverted trapezoidal shape whose upper opening is wider than a lower opening. Here, an angle formed between the both sides of the aperture a14 is preferable to be more than 90 degrees and more preferably to be more than 135 degrees. Thereby, it becomes possible to form the trench t15 formed by side and bottom surfaces of the gate insulating film 15 (second insulating film) formed within the aperture a14 to have the cross-section of the inverted trapezoidal shape whose angle formed by the both sides and the bottom of the trench t15 is similarly widely opened upward by more than 90 degrees. This angle is preferable to be 135 degrees or more because it is more effective in terms of decreasing a concentration of electric field and others.

The gate insulating film 15 is formed so as to cover at least the upper surface of the carrier supplying layer 13 exposed by the aperture a14 of the passivation film 14. It is noted that the gate insulating film 15 may extend over the side surfaces of the aperture a14 and the upper surface of the passivation film 14 as shown in FIG. 1. It is preferable to form the gate insulating film 15 by SiN having a relatively high refractive index of around 2.0 to 2.2 for example. It becomes possible to realize a lower on resistance because it is possible to suppress the reduction of the drain current caused by the current collapse by forming at least the bottom of the trench t15 formed in the insulating films (14, 15) on the carrier supplying layer 13 by the gate insulating film 15 formed of SiN whose refractive index is around 2.0 to 2.2. However, the invention is not limited to that and may form the gate insulating film 15 by using various insulating materials such as SiN whose refractive index is not around 2.0 to 2.2, $SiO_2$ and the high dielectric materials as described above for example.

The trench t15 is formed by a surface of the gate insulating film 15 within an aperture a15 by forming the gate insulating film 15 within the aperture a14 of the passivation film 14. This trench t15 has the inverted trapezoidal shape whose cross-section is widely opened upward such that the angle formed between the both sides and the bottom is 90 degrees or more as described above. It becomes possible to reduce the concentration of electric field that is otherwise generated at a corner formed in the gate electrode 21 by a corner of the trench t15 while suppressing the device from being enlarged by the gate electrode 21 formed from the bottom of the trench t15 toward the drain electrode 22d by forming the trench t15 as described above. As a result, it becomes possible to suppress a damage of the element otherwise caused by a dielectric breakdown and to improve its withstanding characteristic. It is noted that a more preferable shape of the trench t15 is a shape having an angle (tapered angle), formed by the respective side surfaces of the trench t15 and the upper surface of the passivation film 14, of around 150 degrees. However, the invention is not limited to such a degree and may be modified variously as long as the angle permits to fully reduce the concentration of electric field generated at the corner formed in the gate electrode 21 by the trench t15 as described later. That is, it will do if the tapered angle formed between the side surfaces and the bottom of the trench t15 is greater than 90 degrees and specifically it is desirable to be 135 degrees or more.

The gate electrode 21 is formed on the gate insulating film 15 within the aperture a14 of the passivation film 14. Thus, the MIS-type HEMT 1 of the present embodiment has the so-called MIS structure in which the gate insulating film 15 (I) is disposed on the semiconductor layer (S) composed of the carrier traveling layer 12 and the carrier supplying layer 13 and the gate electrode 21 (M) is disposed further on the gate insulating film 15 (I). Because this structure permits to reduce the influence of the current collapse and the gate leak current, it becomes possible to realize the enhanced withstanding characteristic and the reduction of the on resistance. Still more, because the tapered angle of the trench t15 is larger than 90 degrees as described above, the concentration of electric field caused at the corner formed in the gate electrode 21 is reduced.

It is preferable to form the gate electrode 21 by using conductors whose electrical conductivity is relatively large, such as titanium (Ti), platinum (Pt) and gold (Au). Thus, a conductor film having a multi-layered structure in which a Ti film, a Pt film, an Au film and a Ti film are superimposed one after another is used in the present embodiment.

The gate electrode 21 includes a field plate (FP) portion 21a formed on the gate insulating film 15 from the inside of the aperture a14 toward the drain electrode 22d. It becomes possible to reduce the influence of the current collapse and to realize a greater drain current by providing the FP portion 21a because an electric field caused by driving voltage may be generated under the FP portion 21a.

The interlayer insulating film 16 for example covers the gate insulating film 15 on which the gate electrode 21 is formed. The interlayer insulating film 16 is a layer for electrically separating the semiconductor element (the HEMT in the present embodiment) formed on the semiconductor layer composed of the carrier traveling layer 12 and the carrier supplying layer 13 from an upper element, wires and the like. This interlayer insulating film 16 may be formed of $SiO_2$ for example. However, the invention is not limited to that and may form the interlayer insulating film 16 by using various insulating materials such as SiN for example.

The MIS-type HEMT 1 of the present embodiment has the FP electrode 23 for leading out the source electrode 22s on the carrier supplying layer 13 above the interlayer insulating film 16. The FP electrode 23 is formed of a contact portion 23b that penetrates through the interlayer insulating film 16, the gate insulating film 15 and the passivation film 14 and a field plate (FP) portion 23a formed on the interlayer insulating film 16. At least a part of the FP portion 23a extends above the gate electrode 21. Thereby, it becomes possible to relax a difference of potential generated between the gate and the source and to enhance the withstanding characteristic as a result even when a relatively large current such as a surge current flows into the side of the source electrode 22s. It is noted that the FP electrode 23 may be formed by using a metal or an alloy such as Al. However, the invention is not limited to that and may form the FP electrode 23 by using various conductive materials.

As described above, the MIS-type HEMT 1 of the present embodiment has the insulating films formed of the passivation film 14 (corresponding to the first insulating film for example) and the gate insulating film 15 (corresponding to the second insulating film for example) on the carrier supplying layer 13. Still more, the inverted trapezoidal trench t15 having the cross-section whose upper opening is wider than the bottom surface is formed in the region of the insulating films interposed between the source and drain electrodes 22s and 22d and the gate electrode 21 is formed from the bottom of the trench t15 to the insulating film on the side of the drain electrode 22d. Having such a structure, the MIS-type HEMT 1 of the present embodiment can enhance the withstanding characteristic further and reduce the on resistance further because it is possible to reduce the current collapse and the gate leak current by the MIS structure and to reduce the current collapse further by the gate field plate structure in the semiconductor device having the HEMT structure that is capable of realizing excellent high temperature operating characteristics and a large driving current. Still more, because the tapered angle of the side surfaces of the trench t15 is 90 degrees or more, it is possible to reduce the concentration of electric field otherwise generated at the corner of the gate electrode 21. As a result, it becomes possible to suppress the damage of the element otherwise caused by the dielectric breakdown and to enhance the withstanding characteristics of the element.

(Fabrication Method)

Next, a method for fabricating the MIS-type HEMT 1 of the present embodiment will be explained in detail with reference to the drawings. FIGS. 2A through 3C are process diagrams showing the method for fabricating the MIS-type HEMT 1 of the present embodiment. It is noted that FIGS. 2A through 3C show cross-sections corresponding to FIG. 1.

According to the method, the supporting substrate 10, i.e., the silicon (111) substrate, is introduced into a MOCVD (Metal Organic Chemical Vapor Deposition) apparatus at first and then the MOCVD apparatus is vacuumed by a turbo pump in this state to depressurize a chamber of the apparatus around to $1 \times 10^{-6}$ hPa or less. In succession, ammonia is introduced, the pressure within the chamber of the MOCVD apparatus is boosted around to 100 hPa and substrate temperature is increased up to 1,050° C. After stabilizing the substrate temperature, trimethyl aluminum (TMA) and ammonia, i.e., base materials, are introduced on the upper surface of the supporting substrate 10 while rotating the supporting substrate 10 at 900 rpm. At this time, TMA is introduced with a flow rate of 10 $cm^3$/min and ammonia is introduced with a flow rate of 12 liters/min for example. A growth time may be around four minutes for example. Thereby, an aluminum nitride film (AlN) around 50 nm thick for example is formed on the supporting substrate 10. Next, a GaN layer around 20 nm thick for example is formed by using the MOCVD apparatus in the same manner and an AlN layer around 5 nm thick for example is formed on the GaN layer to form a laminate film (hereinafter referred to as an AlN/GaN laminate film) formed of the GaN and AlN layers. The laminate film is formed on the AlN layer formed as described above. The buffer layer 11 whose total thickness is around 1,550 nm for example is formed by superimposing the AlN/GaN laminate films by about 60 layers.

Next, trimethyl gallium (TMG), i.e., a base material, is introduced with a flow rate of 300 $cm^3$/min for example when the substrate temperature is stabilized at 1,050° C. while introducing ammonia with a flow rate of 12 liters/min for example within the same chamber. A growth time at this time may be 2,000 seconds for example. Thereby, the carrier traveling layer 12 formed of the undoped GaN layer of around 3,000 nm thick for example is formed on the buffer layer 11.

Next, trimethyl aluminum (TA), trimethyl gallium (TMG) and ammonia are introduced on the upper surface of the carrier traveling layer 12 with flow rates of 50 $cm^3$/min, 100 $cm^3$/min and 12 liters/min, respectively, while keeping the abovementioned substrate temperature. Thereby, the carrier supplying layer 13 composed of undoped $Al_{0.25}Ga_{0.75}N$ of around 20 nm thick is formed on the carrier traveling layer 12. A growth time at this time may be around 40 seconds for example.

Figure 2A:
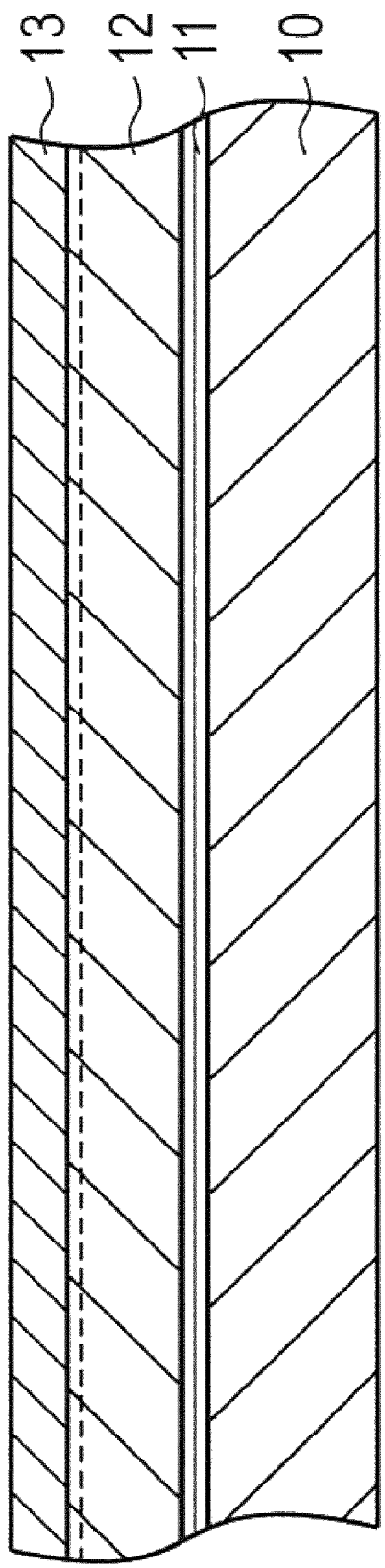
FIGS. 2A, 2B and 2C are process diagrams (part I) showing a method for fabricating the MIS-type HEMT according to the first or second embodiment of the invention.

Through the processes described above, the buffer layer 11, the carrier traveling layer 12 and the carrier supplying layer 13 are grown sequentially on the supporting substrate 10 as shown in FIG. 2A.

Next, elements of an active region including the carrier supplying layer 13 and the carrier traveling layer 12 are separated by etching the supporting substrate 10 from the surface of the carrier supplying layer 13 by means of photolithography for example. It is noted that it is possible to apply dry etching using chlorine gas for example in etching the carrier supplying layer 13, the carrier traveling layer 12, the buffer layer 11 and the supporting substrate 10. Preferably, a trench for separating the elements formed in this process reaches at least to the upper layer of the supporting substrate 10.

Next, the source and drain electrodes 22s and 22d that ohmically contact with the carrier supplying layer 13 are formed on the carrier supplying layer 13 on which the elements are separated by using a lift-off method for example. A silicon oxide film is used for a sacrifice layer used in the lift-off for example and a hydrofluoric acid aqueous solution (hereinafter referred to as buffered hydrofluoric acid) whose pH is modified by ammonia and the like for example is used to remove the sacrifice layer. An alloy containing Ti, Al and Si for example is used for the electrode material. A resistance value on the upper surface of the alloy film is reduced by evaporating W on the alloy film. It is noted that preferably the lift-off of the unnecessary alloy film by the removal of the sacrifice layer is carried out after evaporating W for example because it becomes possible to omit a process of removing the unnecessary W film.

Figure 2B:
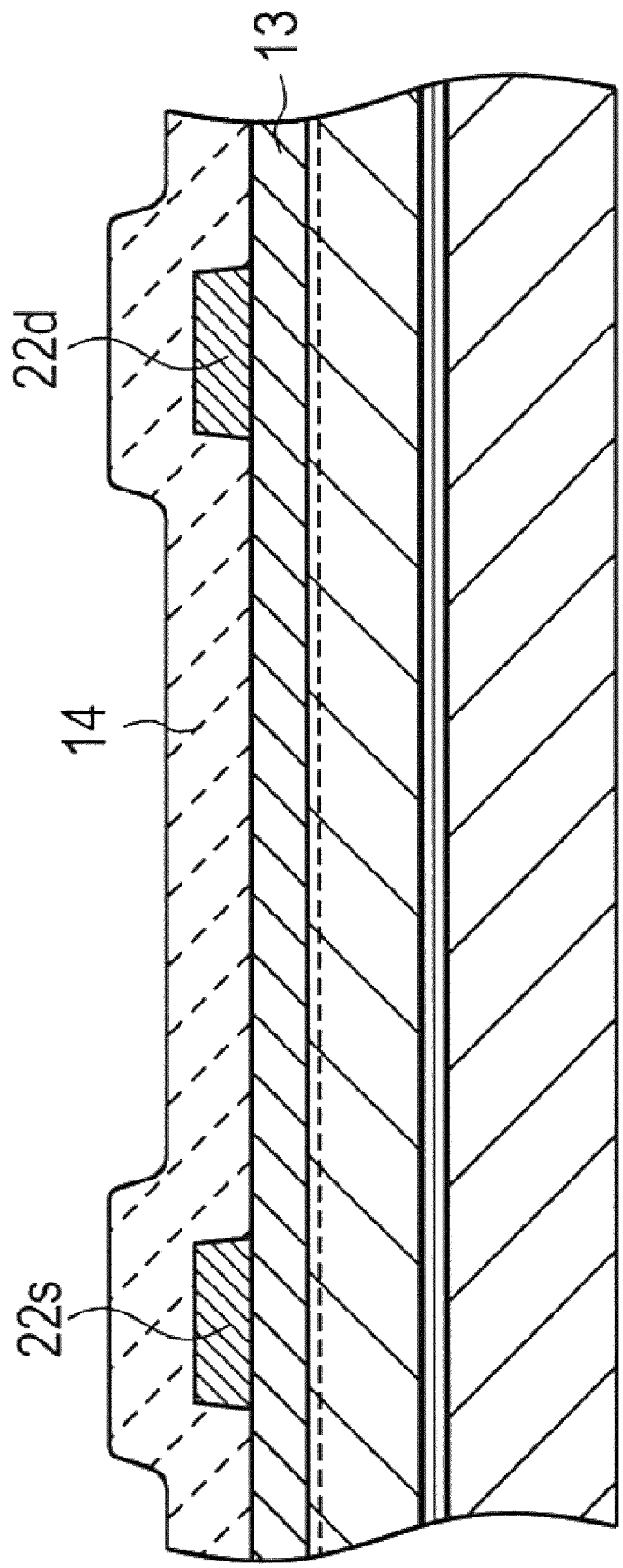

Next, the passivation film 14 whose thickness is around 300 nm and that covers the source and drain electrodes 22s and 22d is formed on the carrier supplying layer 13 as shown in FIG. 2B by forming $SiO_2$ on the carrier supplying layer 13 by using a PCVD (Plasma CVD) method for example (a first insulating film forming process). Although the thickness of the passivation film 14 is 300 nm here, it may be in a range from 100 nm to 500 nm.

Figure 2C:
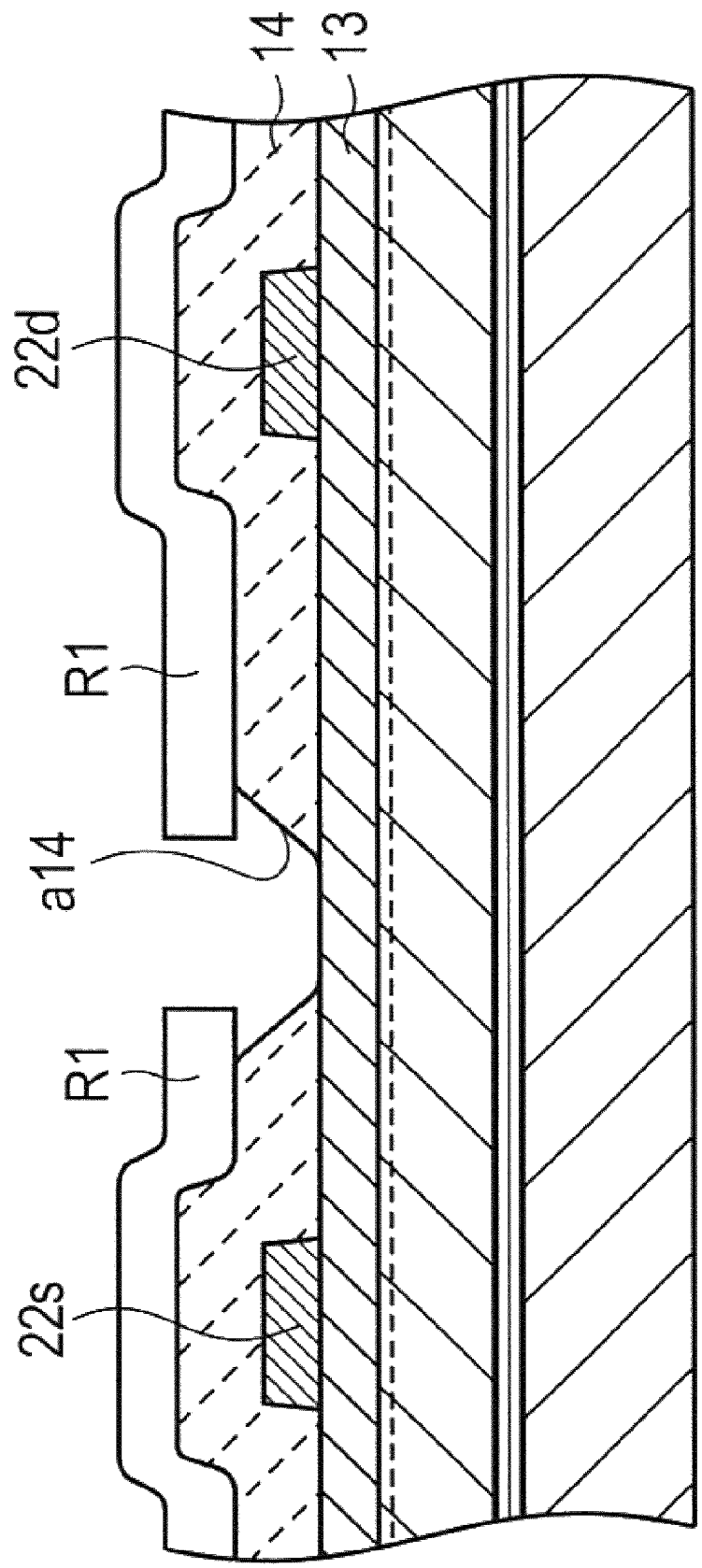

Next, the aperture a14 that exposes the carrier supplying layer 13 is formed in the region where the gate electrode 21 is to be formed as shown in FIG. 2C by patterning the passivation film 14 by a photolithographic method for example (aperture forming process). It is noted that it is preferable to apply wet etching using the buffered hydrofluoric acid as described above for example in etching the passivation film 14. A silicon oxide film, a photosensitive resin film or the like may be used for example for a mask film R1 at this time. Because the wet etching using the buffered hydrofluoric acid allows isotropic etching to be carried out, it is possible to etch the aperture a14 so that its tapered angle is smaller than 90 degrees. It is noted that pH of the buffered hydrofluoric acid used in the wet etching is modified so that the tapered angle formed between a horizontal part and a tapered part of the aperture becomes around 150 degrees for example.

Figure 3A:
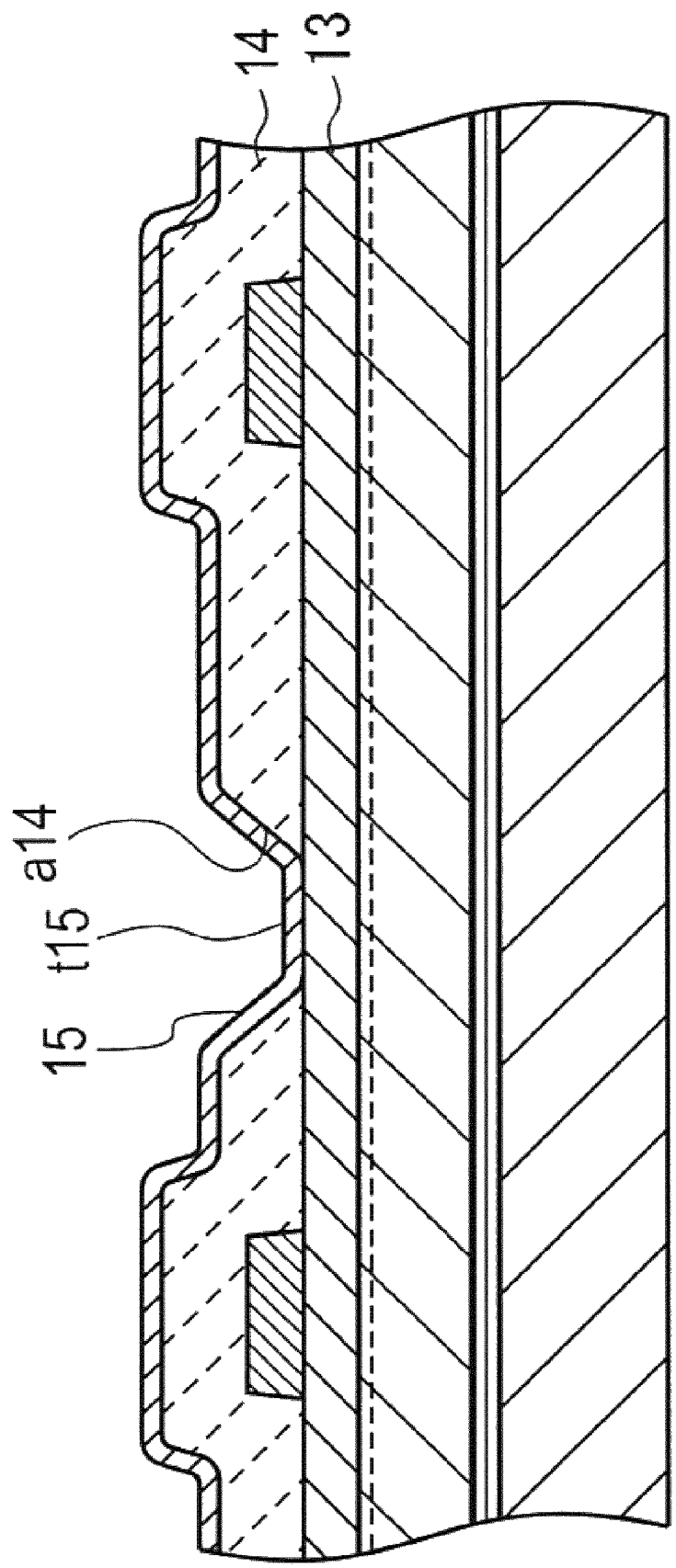
FIGS. 3A, 3B and 3C are process diagrams (part II) showing the method for fabricating the MIS-type HEMT according to the first or second embodiment of the invention.

Next, the gate insulating film 15 made of SiN whose thickness is around 50 nm for example and which covers the carrier supplying layer 13 that is exposed out of the aperture a14 is formed on the passivation film 14 and within the aperture a14 as shown in FIG. 3A by using the PCVD method for example (second insulating film forming process). Although the thickness of the gate insulating film 15 is 50 nm here, it may be in a range from 20 nm to 80 nm. It is noted that mixed gas of silane ($SiH_4$) gas and nitrogen gas or mixed gas of $SiH_4$ gas, nitrogen gas and ammonia may be used in the PCVD method for forming SiN. It is possible to form the gate insulating film 15 having the refractive index of around 2.0 to 2.2 by arranging so that a flow rate of the nitrogen gas and/or ammonia is adjusted to form SiN in a silicon-rich state.

It is noted that the passivation film 14, the aperture a14 and the gate insulating film 15 described above are interposed between the source and drain electrodes 22s and 22d provided on the carrier supplying layer 13 that is formed on the carrier traveling layer 12 for example. Then, the processes for forming the passivation film 14, the aperture a14 and the gate insulating film 15 correspond to the process for forming the insulating films (14 and 15) having the inverted trapezoidal trench t15 whose cross-section of the upper opening is wider than that of the bottom.

Figure 3B:
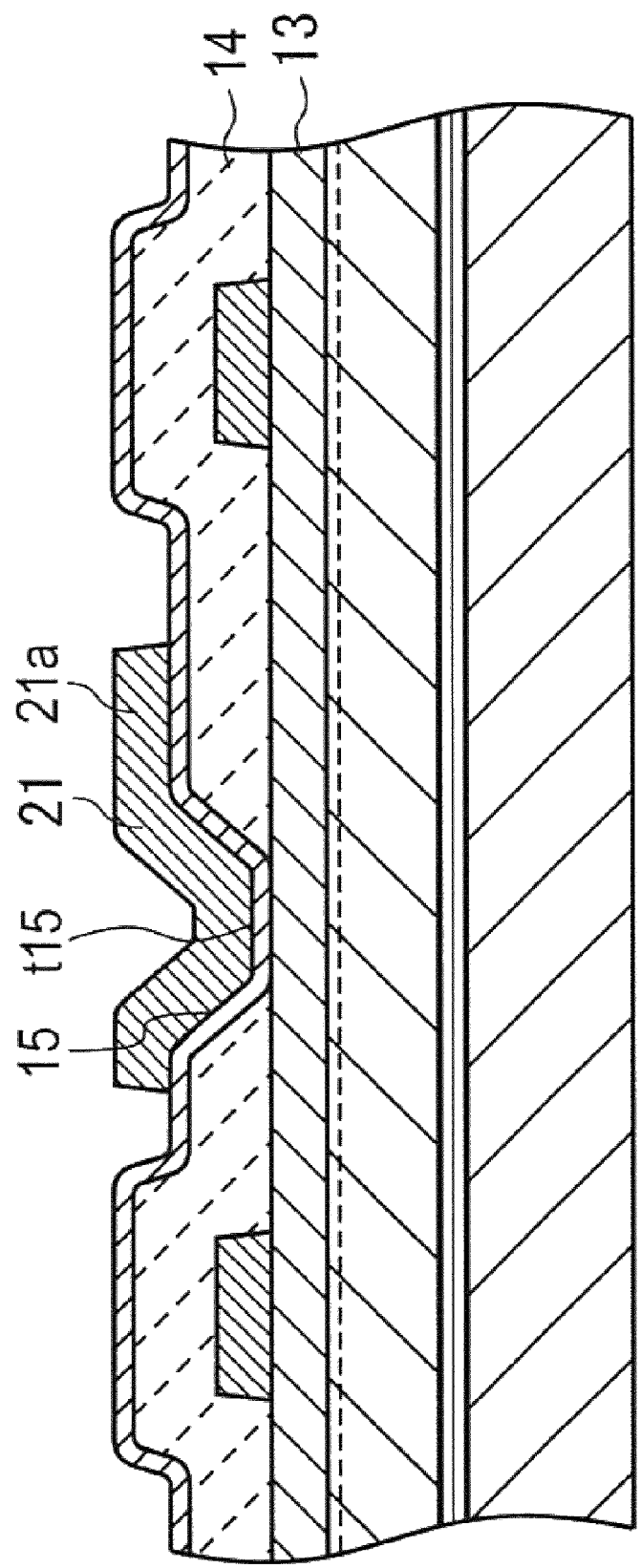

Next, the gate electrode 21 is formed at least on the gate insulating film 15 within the aperture a14 as shown in FIG. 3B by using the lift-off method for example (gate electrode forming process). It is noted that the same materials used in forming the source electrode 22s and 22d described above may be use for the sacrifice layer and its removing solution used in the lift-off. However, the gate electrode 21 is formed of the laminate film of the Ti film, Pt film, Au film and Ti film formed by means of evaporation in the present embodiment. Still more, the gate electrode 21 is formed so as to include the FP portion 21a that extends from the gate insulating film 15 within the aperture a14 to that on the passivation film 14 on the side of the drain electrode 22d.

Next, the interlayer insulating film 16 that covers the gate electrode 21 is formed on the gate insulating film 15 by depositing $SiO_2$ by using a sputtering method for example. It is noted that the upper surface of the interlayer insulating film 16 may be flattened by means of a CMP (Chemical and Mechanical Polishing) for example.

Figure 3C:
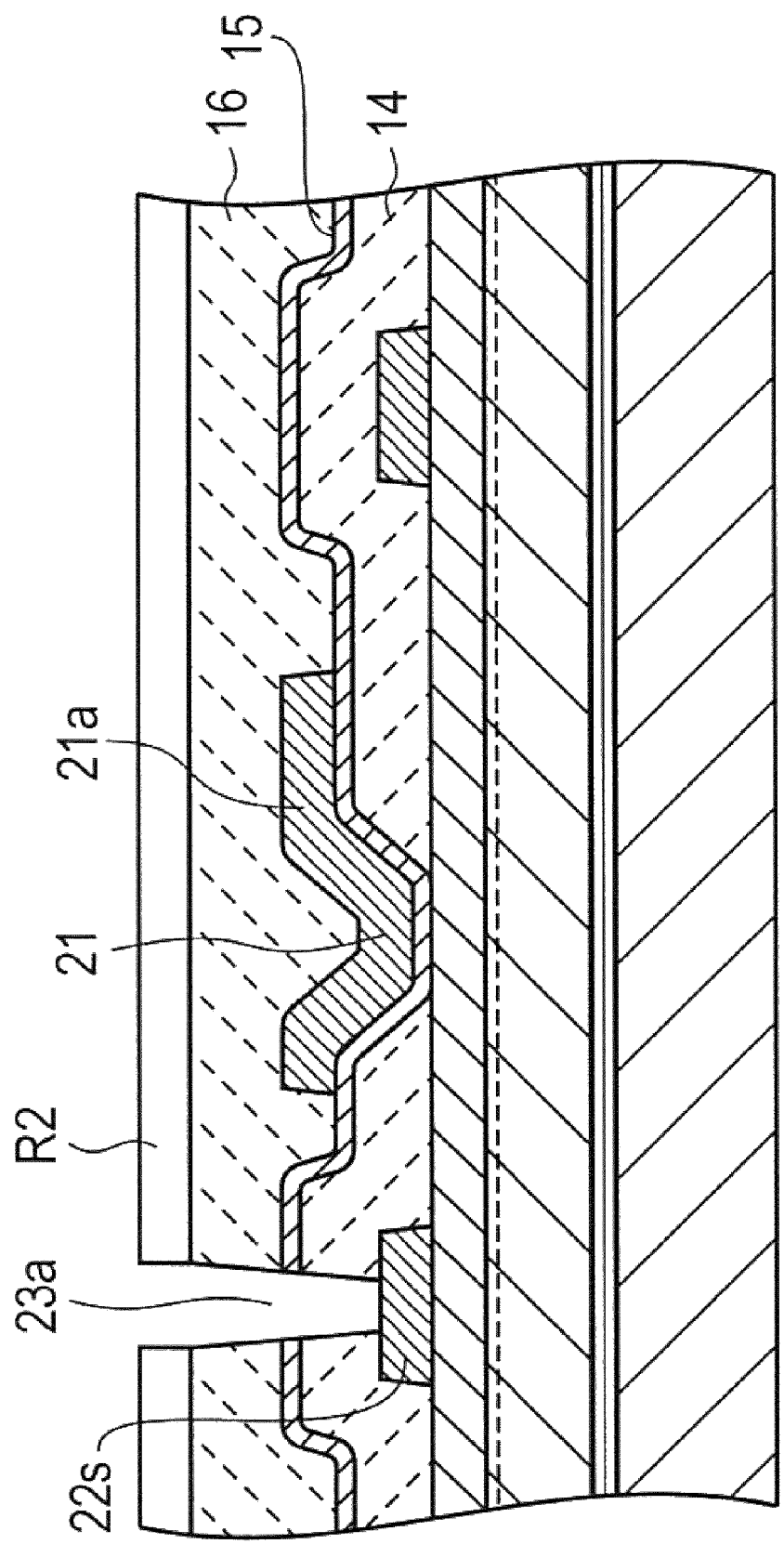

Next, the aperture a23 that exposes the upper surface of the source electrode 22s is formed as shown in FIG. 3C by sequentially etching the interlayer insulating film 16, the gate insulating film 15 and the passivation film 14 by using a photolithographic method using a photo-resist R2 for example. It is noted that it is preferable to use anisotropic dry etching using fluorine gas for example in etching the interlayer insulating film 16, the gate insulating film 15 and the passivation film 14.

Next, the FP electrode 23 that electrically leads out the source electrode 22s above the interlayer insulating film 16 is formed within the aperture a23 and on the interlayer insulating film 16 by using a lift-off method for example. The FP electrode 23 includes the contact portion 23b within the aperture a23 and the FP portion 23a whose part extends at least above the gate electrode 21 as described above. Al for example may be used as a material of this electrode. The MIS-type HEMT 1 shown in FIG. 1 is formed through the processes described above. It is noted that the sequence for forming the respective layers of the invention is not limited to the sequence described above and it is needless to say that it may be appropriately changed.

As described above, the MIS-type HEMT 1 of the present embodiment has the structure in which the gate insulating film 15 is disposed under the gate electrode 21. It allows the influence caused by the current collapse to be reduced in the present embodiment as compared to the HEMT structured by the conventional schottky electrode.

Still more, the MIS-type HEMT 1 of the present embodiment has the structure in which the part (the FP portion 21a) of the gate electrode 21 extends toward the drain electrode 22d, so that the influence caused by the current collapse may be reduced even more.

For instance, a result shows that while on resistance increases due to the influence of the current collapse and others by about 200 V in the HEMT structured by the conventional schottky electrode, on resistance does not increase until about 800 V in the HEMT having the MIS structure and the gate field plate structure of the present embodiment (the MIS type HEMT 1).

Still more, the MIS-type HEMT 1 of the present embodiment has the structure (MIS structure) in which the gate electrode 21 does not directly contact with the carrier supplying layer 13, i.e., the semiconductor layer, so that it is possible to reduce the gate leak current. For instance, the gate leak current could be reduced by around triple digits in the MIS-type HEMT 1 of the present embodiment as compared to the HEMT structured by the conventional schottky electrode. As a result, it becomes possible to realize the remarkably improved withstanding characteristic as compared to that of the conventional HEMT.

As described above, according to the present embodiment, it is possible to reduce the influence of the current collapse and the gate leak current by the MIS structure and to reduce the current collapse further by the gate field plate structure in the source electrode having the HEMT structure that is capable of realizing the excellent high temperature operating characteristics and the large driving current, so that the semiconductor device whose withstanding characteristic is enhanced further and whose on resistance is reduced further may be realized.

First Modified Example

Figure 4:
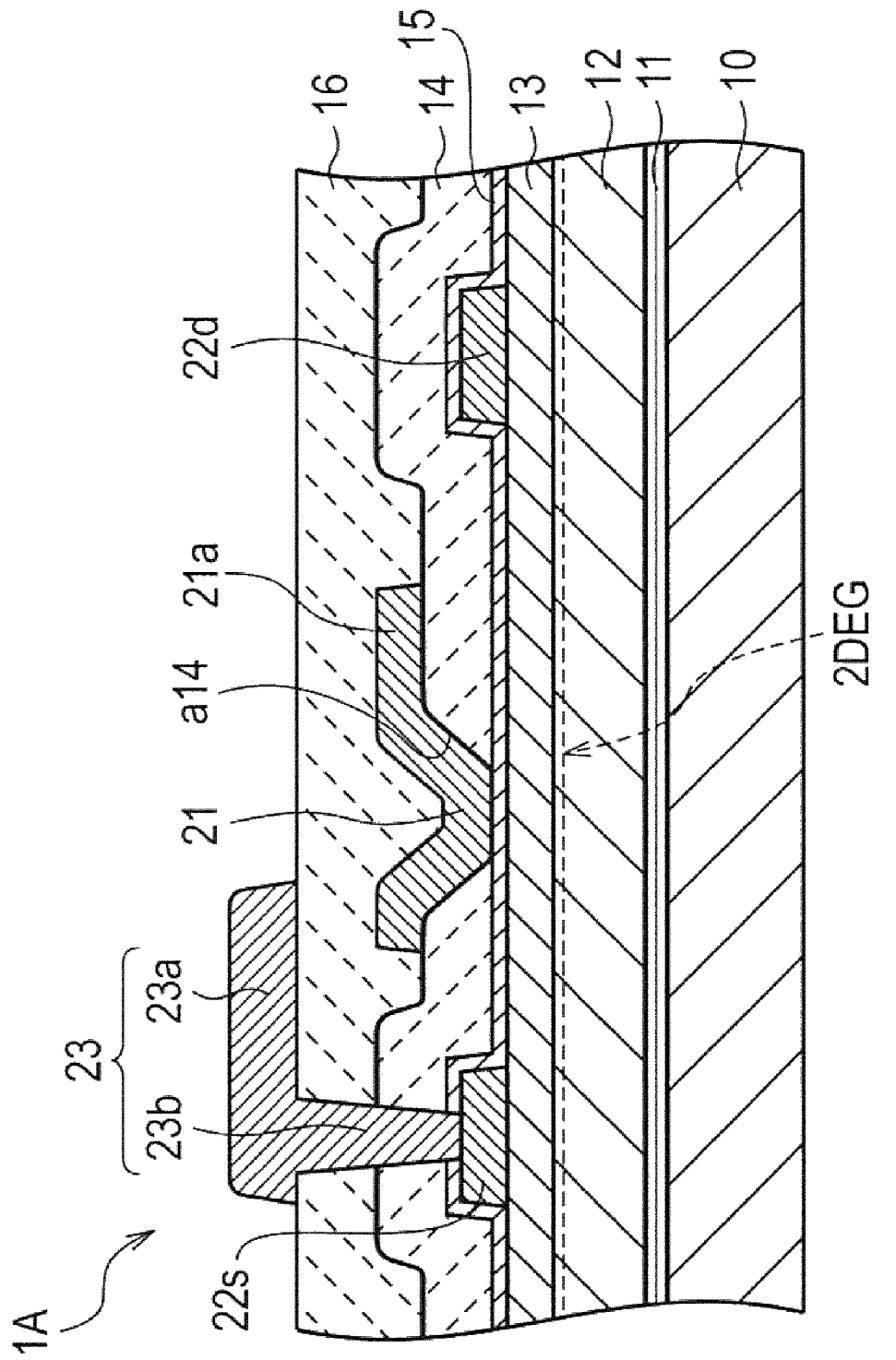
FIG. 4 is a section view showing a modified example of the MIS-type HEMT of the first embodiment of the invention.

FIG. 4 shows a MIS-type HEMT 1A as a first modified example of the MIS-type HEMT 1 of the present embodiment. As it is apparent when FIG. 4 is compared with FIG. 1, the MIS-type HEMT 1 of the present embodiment is different from the MIS-type HEMT 1A of the modified example in that a sequence for forming the passivation film 14 and the gate insulating film 15 is switched. That is, the gate insulating film 15 is formed on the carrier supplying layer 13 on which the source and drain electrodes 22s and 22d are formed (first insulating film forming process), then the passivation film 14 is formed on the gate insulating film 15 (second insulating film forming process) and the aperture a14 (corresponds to the trench t15) that exposes the gate insulating film 15 is formed in the region where the gate electrode 21 is to be formed by patterning the passivation film 14 (aperture forming process).

While the process of forming the passivation film 14 has been the first insulating film forming process and the process of forming the gate insulating film 15 is the second insulating film forming process in the first embodiment, the process of forming the gate insulating film 15 is the first insulating film forming process and the process of forming the passivation film 14 is the second insulating film forming process in this modified example due to the difference of the structures of the semiconductor devices in FIG. 1 and FIG. 4.

Note that it is preferable to etch the passivation film 14 by adopting a condition that permits a fully large selectivity with respect to the gate insulating film 15 in forming the aperture a14. That is, when the gate insulating film 15 is a silicon-rich SiN film and the passivation film 14 is a SiO$_2$ film for example, it is possible to etch the passivation film 14 while keeping the enough selectivity with respect to the gate insulating film 15 by wet etching using a fluorite aqueous solution as an etchant.

Even the MIS-type HEMT 1A having the modified structure as described above may have the same effect with the MIS-type HEMT 1 shown in FIG. 1.

Second Modified Example

Figure 5:
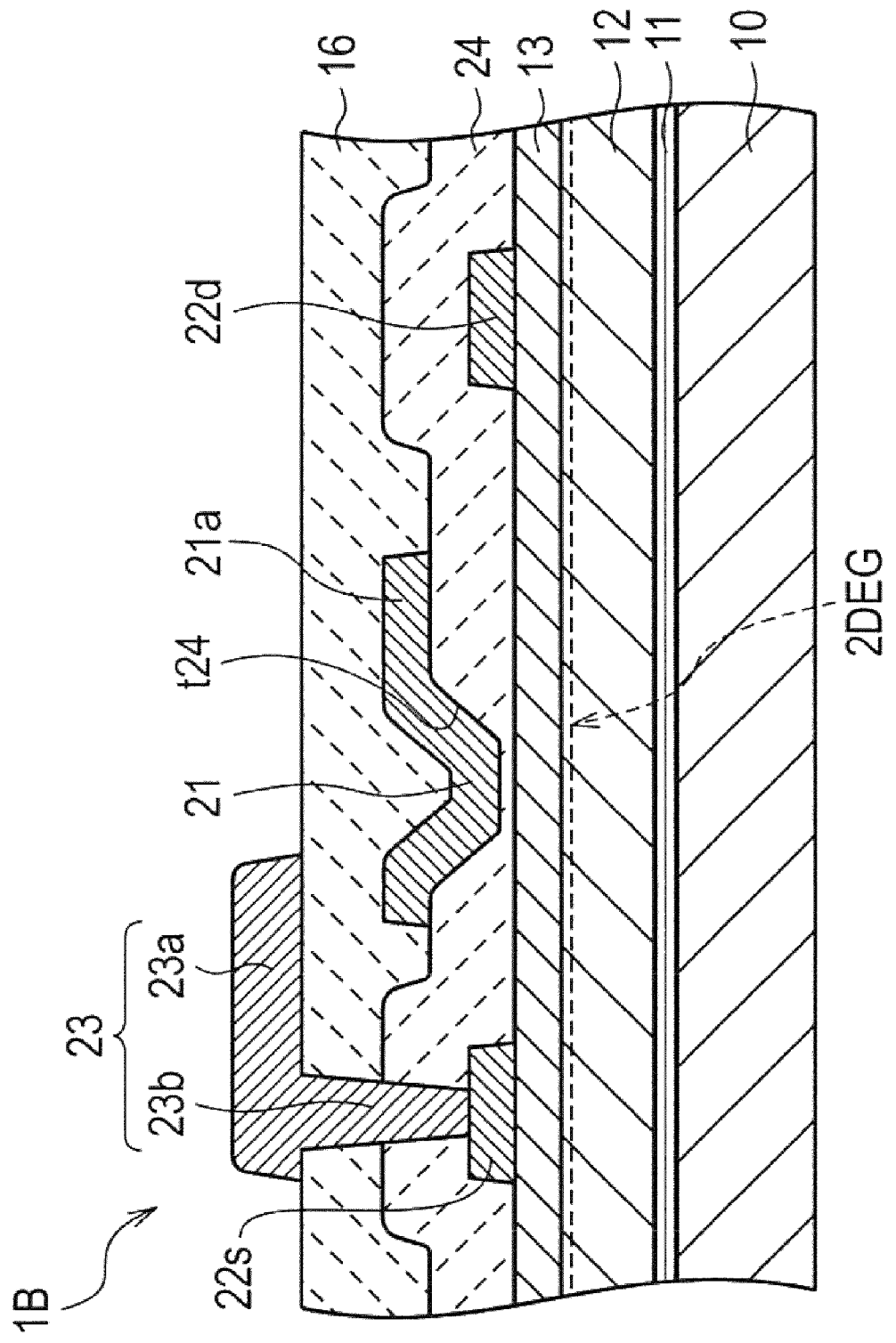
FIG. 5 is a section view showing another modified example of the MIS-type HEMT of the first embodiment of the invention.

FIG. 5 shows a MIS-type HEMT 1B as a second modified example of the MIS-type HEMT 1 of the present embodiment. As it is apparent when FIG. 5 is compared with FIG. 1, the MIS-type HEMT 1 of the present embodiment is different from the MIS-type HEMT 1B of the modified example in that the multi-layer insulating film composed of the passivation film 14 and the gate insulating film 15 is replaced with a single insulating film 24.

The insulating film 24 is formed by using the same material with the gate insulating film 15 for example. A trench t24 that corresponds to the trench t15 in the MIS-type HEMT 1 is formed in the insulating film 24. This trench t24 may be formed by means of wet etching whose etchant concentration and etching time are controlled.

Even the MIS-type HEMT 1B having the modified structure as described above may have the same effect with the MIS-type HEMT 1 shown in FIG. 1.

Second Embodiment

Next, a MIS-type HEMT 2 as a semiconductor device using the GaN semiconductor material of a second embodiment of the invention will be explained in detail with reference to the drawings.

(Structure)

Figure 6:
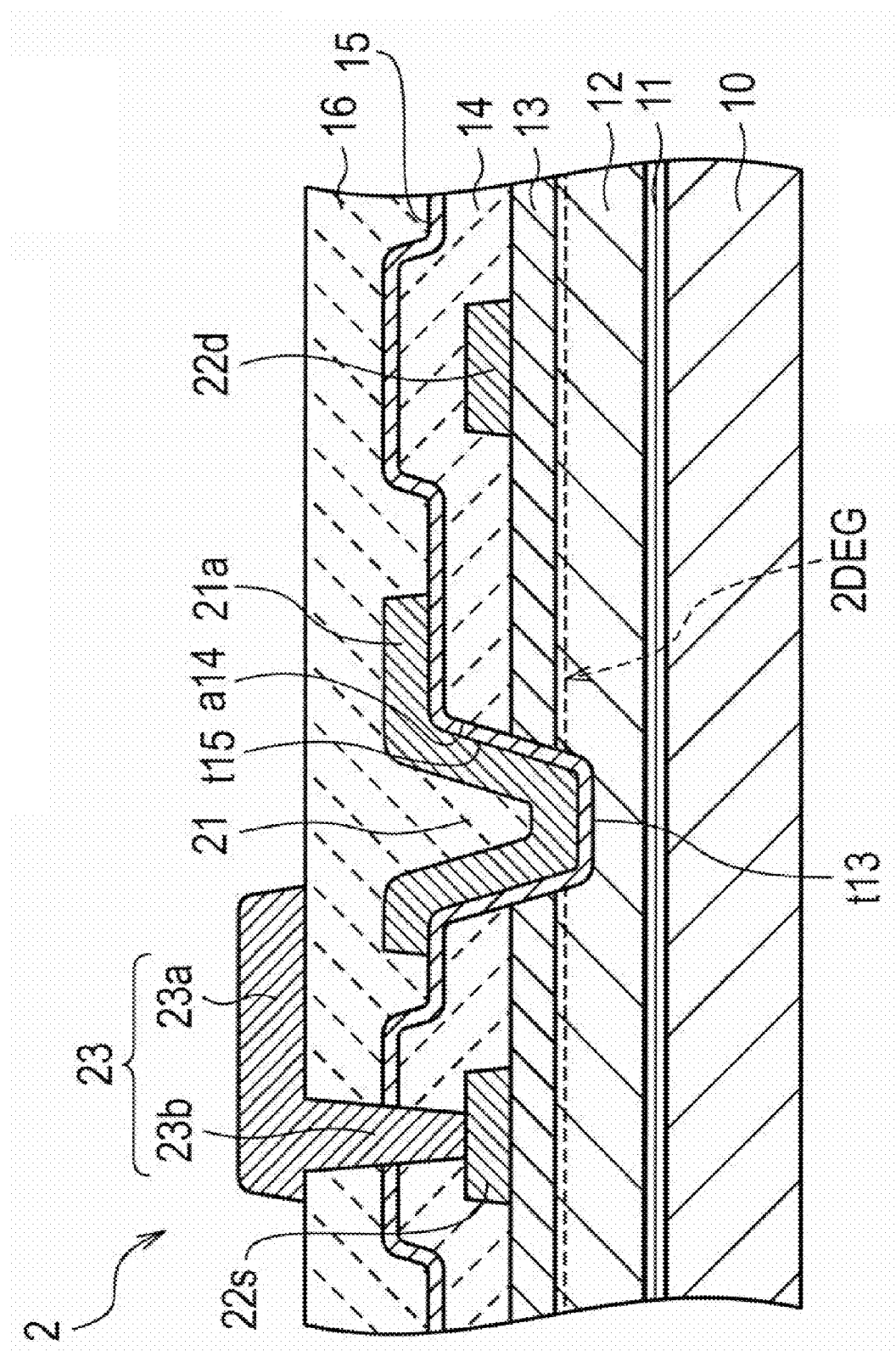
FIG. 6 is a section view showing a schematic structure of the MIS-type HEMT according to the second embodiment of the invention.

FIG. 6 is a section view showing a schematic structure of the MIS-type HEMT 2 of the second embodiment. It is noted that FIG. 6 shows a cross-sectional structure when the MIS-type HEMT 2 is cut along a plane along a gate length direction and vertically to the supporting substrate 10.

As it is apparent when FIG. 6 is compared with FIG. 1, the MIS-type HEMT 2 of the second embodiment has a structure in which a trench t13 that continues to the aperture a14 of the passivation film 14 is formed at an upper part of the very carrier traveling layer 12. That is, the second embodiment has the structure in which the trench t15 in the first embodiment reaches to the upper part of the very carrier traveling layer 12. Thus, the MIS-type HEMT 2 of the second embodiment has a so-called gate recess structure in which the gate having the MIS structure is recessed by the trench t13.

Because the MIS-type HEMT 2 of the second embodiment has the so-called gate recess structure in which the gate insulating film 15 and the gate electrode 21 are formed in the trench t15 (the trench composed of the aperture a14 and the trench t13 formed at the upper part of the carrier traveling layer 12) that penetrates through the carrier supplying layer 13 and reaches to the upper layer part of the carrier traveling layer 12, a normally-off-type element may be structured.

It is noted that the other structures of the second embodiment are the same with those of the MIS-type HEMT 1 of the first embodiment, so that its detailed explanation will be omitted here.

(Fabrication Method)

Next, a method for fabricating the MIS-type HEMT 2 of the second embodiment will be explained in detail. The buffer layer 11, the carrier traveling layer 12 and the carrier supplying layer 13 are formed sequentially on the supporting substrate 10 by using the same processes with those explained in the first embodiment of the invention (see FIG. 2A).

Next, the trench t13 for recessing the gate is formed by etching the carrier supplying layer 13 and the upper layer part of the carrier traveling layer 12 by means of photolithography for example (trench forming process). Thereby, the trench t13 (second trench) that reaches to the upper layer part of the carrier traveling layer 12 is formed under the aperture a14 formed in the process (aperture forming process) explained by using FIG. 2C in the first embodiment of the invention. It is noted that dry etching using chlorine gas for example may be used in etching the carrier supplying layer 13. At this time, the trench t13 is formed so that its cross-section is inverted trapezoidal in order to continue a side surface of the trench t13 with a side surface of the aperture a14 of the passivation film 14 that is formed in the later process as much as possible, i.e., in order to create no step on the side surface of the trench t15 (first trench) composed of the aperture a14 and the trench t13 (second trench) formed on the upper layer part of the carrier traveling layer 12.

When the trench t13 is formed through the carrier supplying layer 13 as described above, the source and drain electrodes 22s and 22d, the passivation film 14 having the aperture a14, the gate insulating film 15, the gate electrode 21, the interlayer insulating film 16 and the FP electrode 23 may be formed sequentially in this fabrication method by using the same processes with those explained in the first embodiment by using FIGS. 2C through 3C. Thereby, the MIS-type HEMT 2 shown in FIG. 6 is fabricated. It is noted that the sequence for forming the respective layers is not limited to the sequence described above and it is needless to say that the sequence may be appropriately changed.

Having the structure as described above, the MIS-type HEMT 2 of the second embodiment can bring about the same effect with the MIS-type HEMT 1 of the first embodiment. Still more, because the MIS-type HEMT 2 of the second embodiment has the gate recess structure, it becomes possible to enhance an electric field formed in the semiconductor layers (12 and 13) under the gate electrode 21. As a result, it becomes possible to increase a concentration of carriers under the gate electrode 21 and to reduce the on resistance during operation further.

It is obvious from the above description that the embodiments described above are merely exemplary cases for carrying out the invention, that the invention is not limited to those embodiments and that the invention may be modified variously corresponding to specifications and others within a scope of the invention.

As described above, according to the invention, the semiconductor device having the HEMT structure in which the carrier traveling layer and the carrier supplying layer are laminated has the so-called MIS structure interposing the gate insulating film under the gate electrode, so that the current collapse and the gate leak current may be reduced by the MIS structure in the semiconductor device having the HEMT that can realize the excellent high temperature operating characteristics and the large driving current due to the low on resistance. Further, because the semiconductor device of the invention has the so-called gate field plate structure in which the gate electrode extends toward the drain electrode, it becomes possible to reduce the current collapse further and to reduce the on resistance further. Still more, because the semiconductor device of the invention has the trench (first trench) having the inverted trapezoidal shape whose cross-section is widened upward, it is possible to reduce the concentration of electric field generated at the corner of the gate electrode 21. As a result, it becomes possible to suppress the damage of the element otherwise caused by the dielectric breakdown and to enhance the withstanding characteristics of the element further. Still more, the invention permits to realize the method for fabricating the semiconductor device that brings about the effects described above.

What is claimed is:

1. A semiconductor device, comprising:
a carrier traveling layer formed on a supporting substrate and made of a group-III nitride semiconductor;
a carrier supplying layer formed on the carrier traveling layer and made of a group-III nitride semiconductor whose band gap energy is greater than that of the carrier traveling layer;
source and drain electrodes that ohmically contact with the carrier supplying layer;
an insulating film formed on the carrier supplying layer; and
a gate electrode formed on the insulating film;
wherein the insulating film includes a first trench formed in a region interposed between the source and the drain electrodes;
the first trench has a shape whose cross-section is inverted trapezoidal in which an upper opening is wider than a bottom thereof; and
the gate electrode is formed at least from the bottom of the first trench onto the insulating film on the side of the drain electrode.

2. The semiconductor device according to claim 1, wherein the insulating film includes a first insulating film formed on the carrier supplying layer and having an aperture formed between the source and drain electrodes and a second insulating film that covers at least an upper surface of the carrier supplying layer exposed by the aperture; and
the bottom of the first trench is formed at least by a surface of the second insulating film formed within the aperture.

3. The semiconductor device according to claim 1, wherein an angle formed between the respective sides of the first trench and the bottom thereof is 90 degrees or more.

4. The semiconductor device according to claim 1, wherein the insulating film at least at the bottom of the first trench is a nitride film.

5. The semiconductor device according to claim 1, further comprising:
an interlayer film formed on the insulating film; and
an electrode that contacts with the source electrode and whose part extends on the interlayer insulating film above the gate electrode.

6. The semiconductor device according to claim 1, wherein the first trench reaches to the inside of the carrier traveling layer; and
the carrier traveling layer has a second trench formed on an upper side of the carrier traveling layer itself and the first trench includes the second trench under the first trench itself.

* * * * *